(12) United States Patent
Dhallé et al.

(10) Patent No.: US 11,944,979 B2
(45) Date of Patent: Apr. 2, 2024

(54) MAGNETIC FIELD GRADIENT APPARATUS AND APPARATUS FOR SEPARATION

(71) Applicant: Urban Mining Corp B.V, Rotterdam (NL)

(72) Inventors: Marc Maria Jozef Dhallé, Enschede (NL); Jaap Jeroen Kosse, Slagharen (NL)

(73) Assignee: Urban Mining Corp B.V.

( * ) Notice: Subject to any disclaimer, the term of this patent is extended or adjusted under 35 U.S.C. 154(b) by 20 days.

(21) Appl. No.: 17/911,442

(22) PCT Filed: Mar. 16, 2021

(86) PCT No.: PCT/NL2021/050176
§ 371 (c)(1),
(2) Date: Sep. 14, 2022

(87) PCT Pub. No.: WO2021/187976
PCT Pub. Date: Sep. 23, 2021

(65) Prior Publication Data
US 2023/0108019 A1    Apr. 6, 2023

(30) Foreign Application Priority Data
Mar. 16, 2020   (NL) ...................... 2025139

(51) Int. Cl.
*B03C 1/033* (2006.01)
*B03C 1/0355* (2006.01)
(Continued)

(52) U.S. Cl.
CPC .......... *B03C 1/0337* (2013.01); *B03C 1/0355* (2013.01); *H01F 6/06* (2013.01); *H10N 60/857* (2023.02)

(58) Field of Classification Search
CPC ....... B03C 1/0337; B03C 1/0335; B03C 1/32; B03C 2201/18; B03C 2201/22; B03C 2201/24; H10N 60/857; H01F 6/06
See application file for complete search history.

(56) References Cited

U.S. PATENT DOCUMENTS 4,062,765 A * 12/1977 Fay .......................... B03B 5/30
                                                                210/695
4,535,278 A    8/1985 Asakawa
(Continued)

FOREIGN PATENT DOCUMENTS

WO            02/065149 A1    8/2002

*Primary Examiner* — Joseph C Rodriguez
(74) *Attorney, Agent, or Firm* — N.V. Nederlandsch Octrooibureau (57) ABSTRACT

The invention relates to a magnet apparatus for generating a magnetic field, the magnet apparatus comprising: at least three coils arranged besides each other along a first axis in a first plane, wherein each coil comprises a conductor comprising a material having superconducting properties at an operating temperature, the coils further comprise two legs and two bent end sections in the first plane, wherein a first and a second leg are arranged parallel to each other along a second axis in the first plane transverse to the first axis, and the two bent sections are arranged opposite to each other; and a controller arranged to control currents through the respective coils to obtain a current distribution in the first plane, wherein a current direction of the current distribution is alternating between opposite directions parallel to the second axis, with a period λ along the first axis. The invention also related to a magnetic density separation apparatus comprising the magnet apparatus.

28 Claims, 4 Drawing Sheets

(51) Int. Cl.
*H01F 6/06* (2006.01)
*H10N 60/85* (2023.01)

(56) References Cited

U.S. PATENT DOCUMENTS

| | | | | |
|---|---|---|---|---|
| 4,702,825 | A * | 10/1987 | Selvaggi | B03C 1/0337 |
| | | | | 62/51.1 |
| 2012/0171085 | A1* | 7/2012 | Den Toonder | B03C 1/24 |
| | | | | 327/108 |
| 2012/0187938 | A1* | 7/2012 | Bar | G01R 33/093 |
| | | | | 324/204 |
| 2014/0065688 | A1* | 3/2014 | Murthy | B03C 1/0335 |
| | | | | 29/850 |
| 2016/0370279 | A1* | 12/2016 | Min | B03C 1/288 |
| 2017/0162309 | A1 | 6/2017 | Kesgin et al. | |
| 2018/0369831 | A1* | 12/2018 | Arnold | B03C 1/0335 |
| 2020/0261922 | A1* | 8/2020 | Kang | B03C 1/0332 |

* cited by examiner

MAGNETIC FIELD GRADIENT APPARATUS AND APPARATUS FOR SEPARATION

FIELD OF THE INVENTION

The present invention relates to a magnetic field gradient apparatus, especially a unidirectional magnetic field gradient apparatus, for generating a magnetic field having a magnetic field gradient in a direction perpendicular to a first plane defined by a first axis and a second axis transverse to the first axis, and relates to an apparatus for separation, especially magnetic density separation.

BACKGROUND ART

Such a magnet apparatus and apparatus for magnetic density separation are known from document "Superconducting Magnetic Density Separation Laboratory Demonstrator" Jaap Kosse, Herman ten Kate, Marc Dhalle, Marcel ter Brake, Peter Rem, 30 Aug. 2017, MT25 Conference 2017, Timetable, Abstracts, Oral and Posters Contribution ID: 1102. The magnet apparatus has to provide a vertical field gradient in a magnetic density separation, MDS, system; magnetic density separation can be used in recycling technology that allows the separation of non-magnetic materials based on mass density. In this process, shredded feed particles are immersed in a ferromagnetic fluid (ferrofluid), which flows over a magnet. The fluid, consisting of a carrier liquid (usually water) with a concentration of ferromagnetic nano-particles dissolved in it, is magnetized by a magnet system that generates a vertical magnetic field gradient. The net force on the feed particles pushes them to an equilibrium height that depends on the mass density of the particle. Different-density particles float at different heights in the fluid bed. The fluid flow drags particles along towards separator blades that collect the different-density streams. The MDS process is cheap and energy efficient compared to alternatives, potentially providing a significant step forward towards a circular use of resources.

Known MDS systems use permanent magnets, usually in the form of Halbach arrays, which are limited in pole size and strength. Superconductivity can offer enhanced separation resolutions, feeds of wider density ranges and use of a more dilute ferrofluid (resulting in lower costs). However, the magnet apparatus requires a magnetic field with dedicated conditions such as having a field gradient vertical or transverse to the surface of the magnet that changes with distance from the magnet and having a constant magnitude in a horizontal direction.

SUMMARY OF THE INVENTION

It is therefore an object of the invention to provide a magnet apparatus for efficiently generating a magnetic field that approaches these conditions.

According to an aspect of the invention this and other objects are achieved by a magnetic field gradient apparatus, especially a unidirectional magnetic field gradient apparatus, for generating a magnetic field having a magnetic field gradient in a direction perpendicular to a first plane defined by a first axis and a second axis transverse to the first axis, wherein the first axis and the second axis are in the first plane, and the magnetic field is obtained by having a current distribution of a current in the first plane with a current direction of the current distribution alternating between opposite directions parallel to the second axis with a period $\lambda$ along the first axis, and wherein the magnet apparatus comprises:

leg sections extending along the second axis and arranged besides each other along the first axis, wherein a distance between adjacent leg sections is $\lambda/6$, and a width of a leg section having an adjacent leg section on either side is $\lambda/3$, as seen along the first axis, wherein the leg sections comprise a conductor for the current; and a controller configured to control current through the respective leg sections, wherein the leg sections and the controller are arranged to provide a current direction in adjacent leg sections in opposite directions to obtain the current direction of the current distribution alternating between opposite directions parallel to the second axis with the period $\lambda$ along the first axis.

In this description the first, second and third axes correspond to the respective x, y, and z axes of a Cartesian coordinate system.

In an embodiment, each leg section comprises a conductor comprising a material having superconducting properties at an operating temperature.

In an embodiment, a width of a leg section having only an adjacent leg section on one side is smaller than $\lambda/3$, as seen along the first axis, optionally the width of the leg section having only an adjacent leg section on one side is $\lambda/6$, as seen along the first axis.

In an embodiment, a current is equal in each leg section having an adjacent leg section on either side as seen along the first axis.

In an embodiment, the apparatus comprises:

coils, optionally at least three coils, arranged besides each other, as seen along the first axis, in the first plane, wherein each coil comprises a conductor for the current, each coil further comprises a first leg, a second leg and two bent end sections in the first plane, the first and the second leg of each coil are arranged parallel to each other along the second axis in the first plane, and the two bent sections are arranged opposite to each other to connect the first leg and the second leg of each coil, and wherein the first leg of a coil is adjacent the second leg of an adjacent coil and vice versa, as seen along the first axis, and the first legs and the second legs of the coils are configured and arranged to form the leg sections, wherein the controller is arranged to control current through the respective coils.

In an embodiment, a distance between centers of adjacent coils is $\lambda/2$, as seen along the first axis, and the controller is arranged to control a current direction in the first leg of a coil to be equal to a current direction in the second leg of an adjacent coil and vice versa.

In an embodiment, a width of the respective coils is $\lambda/2$, a width of the first legs is $\lambda/6$, and a width of the second legs is $\lambda/6$, as seen along the first axis.

In an embodiment, the first leg of a coil and the second leg of an adjacent coil, and vice versa, together form a leg section.

In an embodiment, the apparatus comprises three or five coils.

In an embodiment, a distance between centers of adjacent coils is $\lambda$, as seen along the first axis, and the controller is arranged to control a current direction in the first leg of a coil to be opposite to a current direction in the second leg of an adjacent coil and vice versa.

In an embodiment, a width of the respective coils is 5λ/6, a width of the first legs is λ/3, and a width of the second legs is λ/3, as seen along the first axis.

In an embodiment, the first legs and the second legs of the respective coils separately form the leg sections.

In an embodiment, the apparatus comprises three coils.

In an embodiment, a current is equal in each respective coil.

In an embodiment, the respective coils are racetrack-shaped coils.

The legs can be linear sections. The bent end sections can have a semi-circular shape.

The invention is based on the insight that this arrangement of leg sections, and of the coils, the so-called racetrack coils, to form the leg sections wherein the directions of the currents through the respective coils is controlled by the controller, provides a current variation distribution, that varies stepwise along the first axis with a periodicity λ, and proves to be a useful approximation of the required harmonic current distribution. The currents are electrical currents Furthermore, this arrangement provides a magnetic field with a small magnetic field gradient variation in a direction along the first axis parallel to the first plane. The ideal field for MDS is a magnetic field with a gradient in the third direction that changes with distance z0 from the first plane but is constant in a direction parallel to the first plane over a certain distance depending on the application. This ideal field can generated theoretically by an infinite periodic sheet current of the form $$K(x) = K_0 \cos\left(\frac{2\pi}{\lambda}x\right)\hat{y} \qquad (1)$$

wherein K represents the sheet current density at a position x, $K_0$ represents a constant, $\hat{y}$ represents a unit vector in the y-direction, and λ represent the predetermined periodicity of the harmonic current distribution. The resulting magnetic field above the sheet, i.e. the x, y plane at z=0, has a magnitude that decays exponentially with distance z along the third axis and does not vary in a direction in a plane parallel to the first plane:

$$H(z) = \frac{K_0}{2}\exp\left(-\frac{2\pi}{\lambda}z\right) \qquad (2)$$

Wherein H(z) represents the magnetic field at a height z from the first plane. The periodicity λ of the current distribution determines the decay rate of the magnetic field in the third direction. The period λ can be for example 0.6 meter depending on the applications, for example shredded mother board particles, and can be 2 meters, for example, for plastic particles. Conductors comprising a superconducting material are well suited for use in these coils. When the coils comprising this material are cooled down to the operating temperatures, for example, lower than 4.5 K, superconductivity occurs and a magnetic field strength of for example 5 T can be obtained. Superconductivity offers an enhanced separation resolution and the use of a ferrofluid with a lower nanoparticle concentration compared to the permanent magnets conventionally employed in this technology. During the cleaning of the feed particles after separation, a fraction of the ferrofluid is lost. These losses are a significant cost component in this technology; a reduction of the required nano-particle concentration thus offers reduced operational expenditures. Furthermore, superconducting magnets can generate higher field strengths and allow lifting and thus separation of particles with a higher density than compared with conventional magnets.

In an aspect the invention provides for a magnet apparatus for generating a magnetic field, especially a (unidirectional) magnet field gradient apparatus for generating a magnetic field having a magnetic field gradient in a direction perpendicular to a first plane, the apparatus comprising at least three coils arranged besides each other along a first axis in a first plane, wherein each coil comprises a conductor comprising a material having superconducting properties at an operating temperature, the coils further comprise two legs and two bent end sections in the first plane, wherein a first and a second leg are arranged parallel to each along a second axis in the first plane transverse to the first axis, and the two bent sections are arranged opposite to each other; and a controller arranged to control currents through the respective coils to obtain a current distribution in the first plane, wherein a current direction of the current distribution is alternating between opposite directions, parallel to the second axis, with a period λ along the first axis.

In an embodiment the magnet apparatus comprises three or five coils, wherein the distance between the centers of the respective coils is equal to λ/2, as seen along the first axis, and the controller is further arranged in that a current direction in the first leg of one of two adjacent coils is equal to a direction of the current direction in the adjacent second leg of the other one of the two adjacent coils. This arrangement provides a desired current distribution wherein the current direction of the current distribution is alternating between opposite directions parallel to the second axis, with the period λ.

This arrangement of so-called "narrow coils", wherein the width of the coils can be equal or less than λ/2, provides a strong decay of the magnetic field in the third or z-direction in accordance with formula (2) and maintains a limited variation in a direction parallel to the first axis or x-axis of the gradient of the magnetic field.

In an embodiment the width of the respective coils is λ/2 and the width of the first and second legs is λ/6, as seen along the first axis. In this embodiment the combined width of the first leg and the adjacent second leg is λ/3 and provides a current distribution that provides a strong decay of the magnetic field in the third or z-direction and a more constant gradient of the magnetic field in a plane parallel to the first plane and provides an improved approximation of the ideal magnetic field for MDS.

In an embodiment the magnet apparatus comprises three coils, wherein the distance between the centers of adjacent coils equals λ, as seen along the first axis, and the controller is further arranged such that a current direction in the first leg of one of the two adjacent coils is opposite to a direction of the current direction in the adjacent second leg of the other one of the two adjacent coils. This embodiment also provides a current distribution wherein the current direction of the current distribution is alternating between opposite directions parallel to the second axis, with the period λ. This arrangement of so called "wide coils" wherein the width of the coils can be less than or equal ton 5λ/6 and the width of the first and second legs is less than or equal to λ/3 provides also a strong decay of the magnetic field in the third or z-direction.

In an embodiment the width of the respective coils is 5/6λ and the width of the respective first and second legs is λ/3, as seen along the first axis. This embodiment provides also a magnetic field with a strong decay in the third or z-direction. However, when this embodiment is compared with the first embodiments comprising the narrow coils, the variation of the vertical magnetic field gradient along the first direction in a plane parallel to the first plane is larger than that generated by magnet apparatus according to the first embodiment.

In an embodiment λ is in the range from 30 to 150 cm, preferably between 50 to 70 cm, more preferably 60 cm. The distance λ can be selected in dependence on the application and the differences in density of a material of respective shredded particles and the strength of the magnetic field.

In an embodiment the material having superconducting properties comprises $NbTi$, $Nb_3Sn$ or $MgB_2$. This superconducting material is well suited for this application, since it is not expensive and readily obtainable. In further embodiments the material having superconducting properties comprises $Bi_2Sr_2CaCu_2O_8$ or $Bi_2Sr_2Ca_2Cu_3O_{10}$, or a rare earth barium copper oxide, in particular one of the group $YBa_2Cu_3O_7$. The conductor may comprise copper (Cu) or copper (Cu)-alloys. The copper or copper-alloys can be applied for forming a matrix comprising the superconducting material.

In an embodiment the respective coils comprise a plurality of windings of the conductor, optionally wherein a diameter of the conductor is 1.4 mm. The number of windings can be, for example, in the range from 1000 to 3000. A typical number is, for example, 2400. In this arrangement, in operation, a current of 300 A can be maintained and a magnetic field strength of 5 T can be generated.

In an embodiment the bent sections of the coils are flared. This flared section has the advantage in that the peak strength of the magnetic field at the end sections of the coil is reduced and the difference between the magnetic field strength at the legs of the coil and the end sections is reduced.

According to another aspect of the invention this and other objects are achieved by an apparatus for separation, especially magnetic density separation, of materials, and comprising an apparatus as referred to above.

These and other features and effects of the present invention will be explained in more detail below with reference to drawings in which a preferred and illustrative embodiments of the invention are shown. The person skilled in the art will realize that other alternatives and equivalent embodiments of the invention can be conceived and reduced to practice without departing from the scope of the present invention.

BRIEF DESCRIPTION OF DRAWINGS

The present invention will be discussed in more detail below, with reference to the attached drawings, in which.

DESCRIPTION OF EMBODIMENTS

In the figures like numerals refer to similar components.

Figure 1:
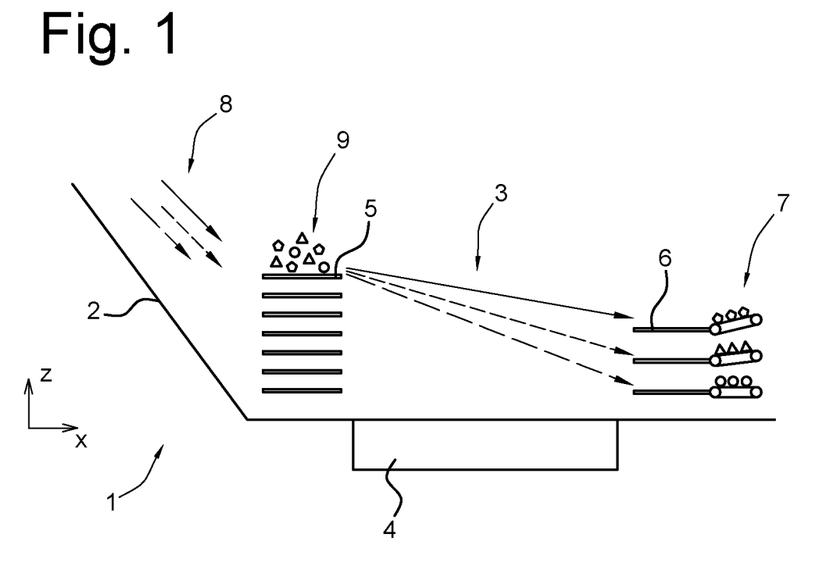
FIG. 1 shows schematically an apparatus for magnetic density separation according to embodiments of this disclosure.

FIG. 1 shows schematically an apparatus for magnetic density separation, MDS, according to embodiments of this disclosure. The apparatus 1 comprises a basin 2 provided with a ferrofluid, a separation chamber 3, a magnet apparatus 4, a flow laminator 5, separator blades 6, and a postprocessor 7. Furthermore, the MDS apparatus is provided with an inlet 8 for shredded particles. In FIG. 1 the shredded particles 9 are indicated by different shapes corresponding to particles having different densities, particles with the same shape have the same density. The known MDS apparatus is provided with permanent magnets for generating a magnetic field for driving the ferrofluid in a saturated magnetization. The strength of magnetic field changes as a function of the distance in the z-direction from the magnet.

Furthermore, FIG. 1 shows x, z coordinates of orthogonal system x, y, z, that is used throughout this description.

In operation, the shredded particles 9 are fed via the inlet 8 and immersed in the ferrofluid in the MDS apparatus. The ferrofluid flows over the magnet apparatus providing the magnetic field with a vertical field gradient. Due to magnetic forces on the ferrofluid the shredded particles will move towards a height that corresponds to their mass density. At the end of the flow path a separator 6 is provided with, for example, four blades and sieves and collects the particles in different groups according to their density, the post processor 7 comprises conveyer belts for transporting the collected particles of the different groups separately to further equipment. In a further step the ferrofluid is recovered and the separated particles can be sorted in a further process for further purification. For example, the MDS apparatus can be used for separation of electronic waste, i.e. shredded printed circuit boards. In a different application plastic particles can be separated according to their density.

It is known from document Magnetic density Separation of Polyolefin Wastes, PhD thesis, University of Technology Delft", that when the magnetic field dependency is given by equation (2), the equilibrium height $z_{eq}$, whereat the vertical position of a feed particle of a given mass density in the ferrofluid is stationary is given by $$z_{eq} = \frac{\lambda}{2\pi} \ln\left(\frac{2\pi\mu_0 M_s H_0}{(\rho_p - \rho_{fl})g\lambda}\right) \quad (3)$$

wherein $H_0$ represents the magnetic field strength at height z=0, $\mu_0$ represent magnetic permeability in vacuum, $M_S$ represents a magnetization of the ferrofluid, $\mu_0$ represents a constant and λ represents a decay rate of the magnetic field, g represents the gravitational acceleration, $\rho_p$ is the mass density of the feed particles and $\rho_n$ is the mass density of the ferrofluid.

For particles with respectively a density $\rho_1$ and $\rho_2$ the separation distance $\Delta z$ can then derived as $$\Delta z = z_{eq}(\rho_2) - z_{eq}(\rho_1) = \frac{\lambda}{2\pi}\ln\left(\frac{\rho_1 - \rho_{fl}}{\rho_2 - \rho_{fl}}\right) \quad (4)$$

Wherein $z_{eq}$ represents the equilibrium height for the respective particles with a density $\rho_1$ and $\rho_2$, $\rho_n$, represents the density of the ferrofluid and $\lambda$ represents the decay rate. This separation distance gives an indication of the obtainable separation resolution. The decay rate $\lambda$ of the magnetic field scales with the distance between the poles of the magnet. A larger $\lambda$ allows for an increased separation distance with a given density range $[\rho_1, \rho_2]$ enhancing the resolution compared to magnets with a smaller distance between the poles. Superconducting magnets can shaped more easily with a larger periodicity $\lambda$, than permanent magnets. Superconducting magnets can also generate higher magnetic field strengths H(z) in the ferrofluid than permanent magnets. This higher field strengths allows to reduce the concentration of ferromagnetic nano-particles in the ferrofluids and also allows to separate feed materials with a higher mass density $\rho_p$ than permanent magnets.

An ideal magnetic field that fulfils these conditions has a gradient in the vertical direction and has no variation in a horizontal plane, spawned by coordinates x, y in the x, y-plane. This ideal magnetic field can be generated theoretically by a sheet current according to equation (2) and reproduced below $$K(x) = K_0 \cos\left(\frac{2\pi}{\lambda}x\right)\hat{y}$$

wherein K represents the sheet current density, $K_0$ represents a constant, and $\lambda$ represents the periodicity of the harmonic sheet current. The generated field magnitude and corresponding vertical gradient decays exponentially with the vertical coordinate z. The inventors have found that that embodiments of the magnet apparatus in this disclosure generate a practical approximation of this ideal magnetic field.

Figure 2:
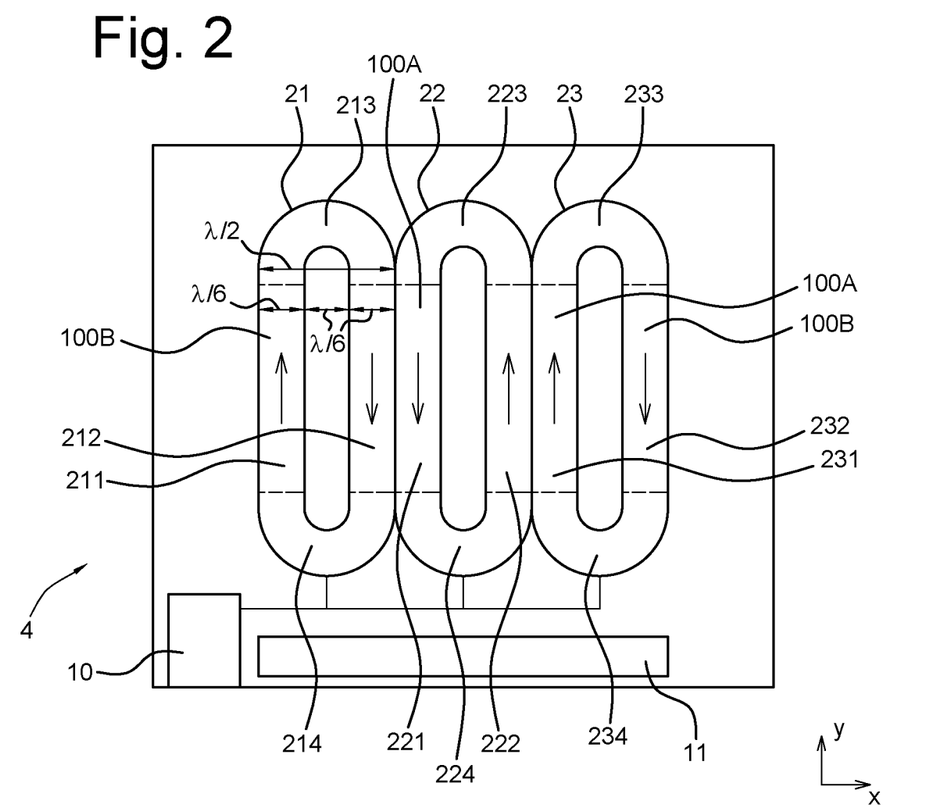
FIG. 2 shows schematically a first example of a magnet apparatus according to a first embodiment of this disclosure.

FIG. 2 shows schematically a first example of a magnet apparatus 4 according to a first embodiment of this disclosure. The figure also shows the x, y coordinates of the orthogonal system x, y, z. The magnet apparatus 4 is provided with three coils 21, 22, 23 and a controller 10. The coils are arranged besides each other along the x-axis in a first, horizontal, plane. Each coil 21, 22, 23 comprise a conductor comprising a material having superconducting properties at an operating temperature. The respective coils 21, 22, 23 comprise two legs 211, 212; 221, 222; 231, 232 and two bent end sections 213, 214; 223, 224; 233, 234. Furthermore, the legs 211, 212; 221, 222; 231, 232 are arranged parallel to each other and along the direction of the y-axis, and the bent end sections 213, 214; 223, 224; 233, 234 are arranged opposite to each other. For clarity of the description, each coil is assigned a first leg 211, 221, 231 and a second leg 212, 222, 232, wherein the first leg of a coil is adjacent the second leg of an adjacent coil and vice versa.

Furthermore, the magnet apparatus is provided with a cryostat 11 to keep the coils at a desired operating temperature. The superconducting material comprises for example NbTi or $MgB_2$. In other embodiments the superconducting material comprises at least one of a rare earth barium copper oxide, in particular one of the group $YBa_2Cu_3O_7$, $Bi_2Sr_2CaCu_2O_8$ and $Bi_2Sr_2Ca_2Cu_3O_{10}$. The conductor may also comprise for example Copper Cu or copper-alloys in a matrix provided with the NbTi superconductive material as is well known the person skilled in the art.

Furthermore, the controller 10 is operationally connected with the coils 21, 22, 23 and is arranged to control respective currents through the respective coils to obtain a predetermined current distribution in the x,y-plane, wherein the current direction of the current distribution is alternating between opposite directions parallel to the y-axis, with a period $\lambda$ along the x-axis wherein the period $\lambda$ is predetermined distance along the x-axis.

In operation, when the coils are in a superconducting state at a temperature of 4.5 K, the controller controls the current through the coils at 300 A and the coils generate a maximum magnetic field of 5.0 T.

In this example the magnet apparatus comprises three coils 21, 22, 23, wherein the distance between the centers of the respective coils equals the period $\lambda/2$ and the controller 10 is further arranged such that for adjacent coils the current direction in the second leg 212, 222 is equal to the current direction in the respective adjacent first leg 221, 231. FIG. 2 shows the current directions in the coils 21, 22, 23 represented with an arrow. The width of the respective coils 21, 22, 23 is $\lambda/2$ and the width of the first and second legs 212, 213; 222, 223; 232, 233 is $\lambda/6$, wherein $\lambda$ is a fixed parameter selected in the range from 30 to 150 cm, preferably between 50 to 70 cm, more preferably 60 cm. in dependence of a selected feed material and separation resolution.

The coils 21, 22, 23 can have a plurality of windings. In this example this number is 2300 and the diameter of the conductor is 1.4 mm resulting in a thickness of the coil in the z-direction of about 5 cm. The coils can be manufactured according to methods well known to the person skilled in the art. In this example, when $\lambda$ is selected at 60 cm, the width of the coils is $\lambda/2=30$ cm. Furthermore, the length of linear sections is 1 m. The length of each of the end sections is 20 cm and the total length of the coils is about 1.4 m. and the width of each coil is 30 cm.

Figure 3A:
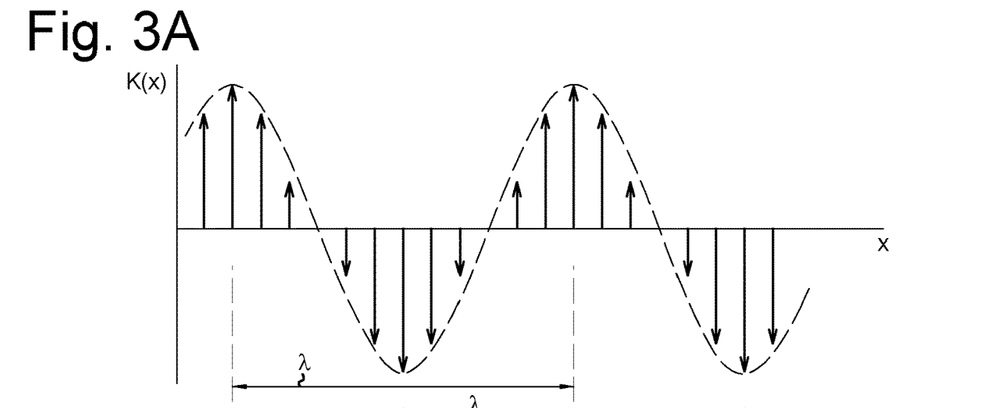
FIG. 3A shows an ideal sheet harmonic current distribution.
Figure 3B:
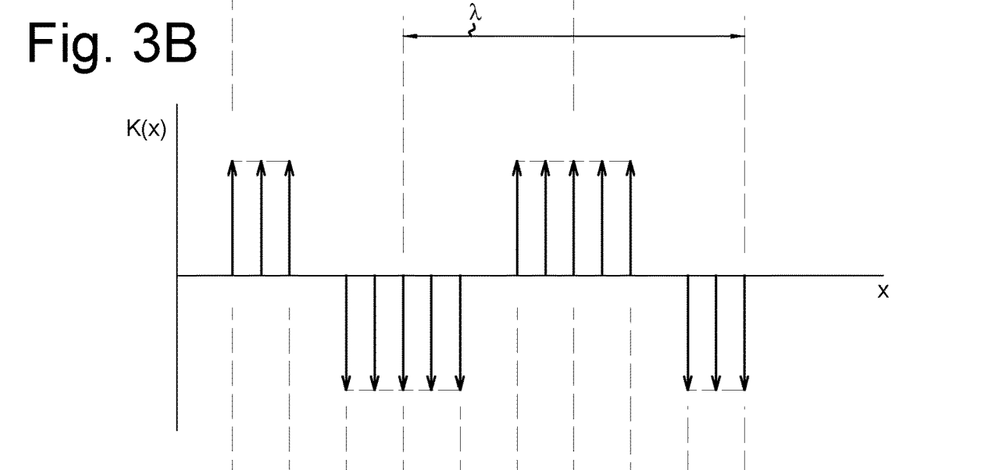
FIG. 3B shows a current distribution corresponding to the embodiment of FIG. 2.
Figure 3C:
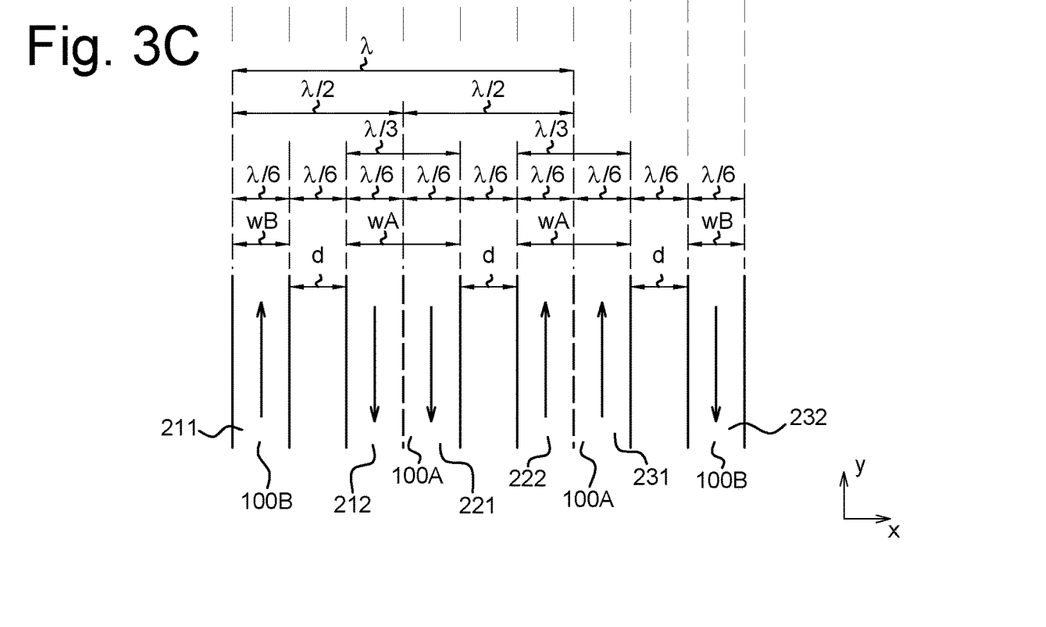
FIG. 3C shows leg segments and current directions corresponding to the embodiment of FIG. 2.

FIG. 3A shows the ideal harmonic sheet current distribution according to equation (2) that is to be approximated with the three coil arrangement of FIG. 2. FIG. 3B shows the current distribution of the embodiment of FIG. 2. In FIGS. 3A and 3B the current distribution $K(x)\hat{y}$ corresponds to the y-axis direction. The ideal current distribution is approximated, as is shown in FIG. 3C by having leg sections 100A, 100B arranged besides each other along the x direction of a first axis. The leg sections 100A, 100B extend along the y direction of a second axis. The distance d between adjacent leg sections 100A, 100B is $\lambda/6$ and the width wA of a leg section 100A having an adjacent leg section 100A, 100B on either side as seen along the x direction of the first axis is $\lambda/3$. The leg sections 100B have only an adjacent leg section on one side as seen along the x direction of the first axis, and have a width wB. Such leg sections 100B are at a beginning or an end of a series of leg sections. The controller is configured to control current through the respective leg sections 100A, 100B. Additionally, the leg sections and the controller are arranged to provide a current direction in adjacent leg sections in opposite directions to obtain a current direction of the current distribution alternating between opposite directions parallel to the y direction of the second axis with a period $\lambda$ along the first axis, as indicated by the arrows in the leg sections, In the embodiment of FIGS. 2 and 3C, the first leg 221 of coil 22 and the second leg 212 of coil 21 together form a leg section 100A, and the first leg 231 of coil 23 and the second leg 222 of coil 22 together form a leg section 100A, both leg sections having a width wA of twice the width λ/6 of the legs of the coils 21, 22, 23. Legs 211 and 232 of coils 21 and 23, respectively, individually form a leg section 100B at the start and end, respectively, of the series of leg sections extending along the x direction of the first axis as shown in FIGS. 2 and 3C. The width wB of leg sections 100B is equal to the width of the legs of the coils.

Figure 4:
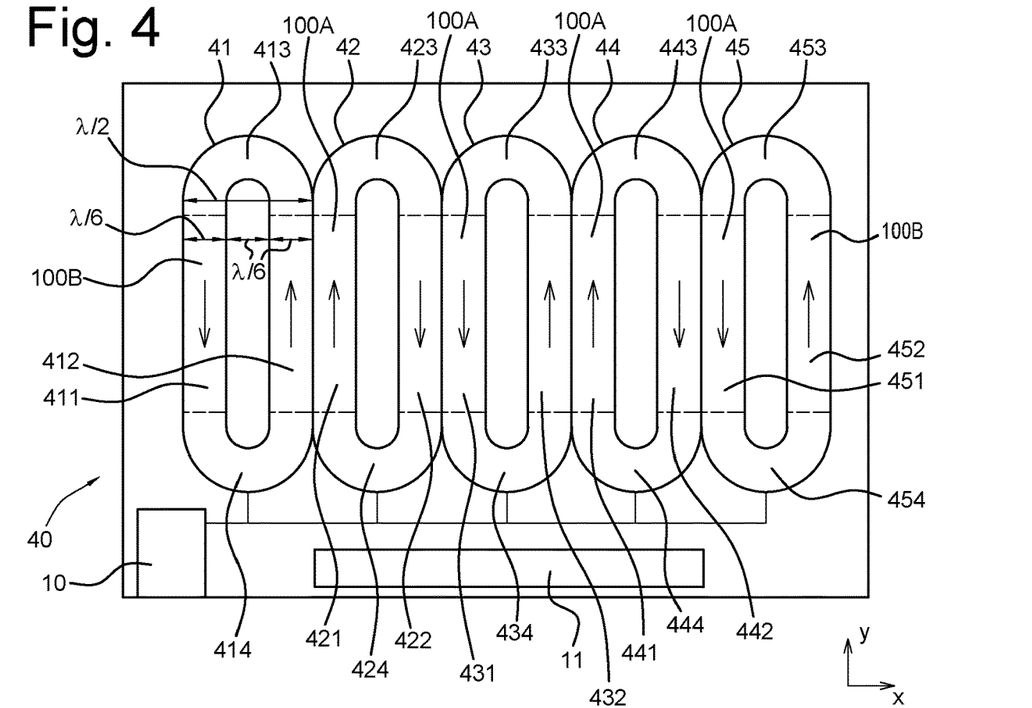
FIG. 4 shows schematically a second example of a magnet apparatus according to the first embodiment of this disclosure.

FIG. 4 shows a second example of magnet apparatus according to the first embodiment of this disclosure. The magnetic apparatus 40 is provided with five coils 41, 42, 43, 44, 45 and a controller 10. The respective coils 41, 42, 43, 44, 45 each comprise two legs 411, 412; 421, 422; 431, 432; 441, 442; 451, 452 and two bent end sections 413, 414; 423, 424; 433, 434; 453, 454. The coils are arranged in the x,y plane in the x-direction. The coils 41, 42, 43, 44, 45 are similar to the respective coils 21, 22, 23 in the first example shown in FIG. 2, and are assigned first legs 411, 421, 431, 441, 451 and second legs 412, 422, 432, 442, 452 in the same manner.

In this example the distance between the centers of the respective coils 41, 42, 43, 44, 45 equals λ/2 and the controller 10 is further arranged such that a current direction in the first leg 412; 422; 432; 442 of one of the two adjacent coils 41, 42; 42, 43; 43, 44; 44, 45 is equal to a direction of the current direction in the adjacent second leg 421; 431; 441; 451 of the other one of the two adjacent coils. In FIG. 4 the current directions in the coils are represented with arrows. The width of the respective coils 41, 42, 43, 44, 45 is λ/2 and the width of the first and second legs 411, 412; 421, 422; 431, 432; 441, 442; 451, 452 is λ/6, wherein A is a fixed parameter selected in the range from 30 to 150 cm, preferably between 50 to 70 cm, more preferably 60 cm. in dependence of a selected feed material and separation resolution. The adjacent first leg and second leg of two adjacent coils together form a leg section 100A having a width wA of λ/3 and having an adjacent leg section on either side in the x direction. Legs 411 and 452 only have an adjacent leg section on one side as seem in the x direction, and individually form a leg section 100B having a width wB of λ/6 an being at the beginning and the end, respectively, of the series of leg sections made up from the legs 411 to 452 shown consecutively in FIG. 4.

The magnet apparatus according to this second example provided with the five coils generates an improved approximation of the ideal magnetic field compared to the approximation generated with the magnet apparatus according to the first example provided with the three coils. This embodiment also approximates the ideal current distribution shown schematically in FIG. 3A.

Figure 5:
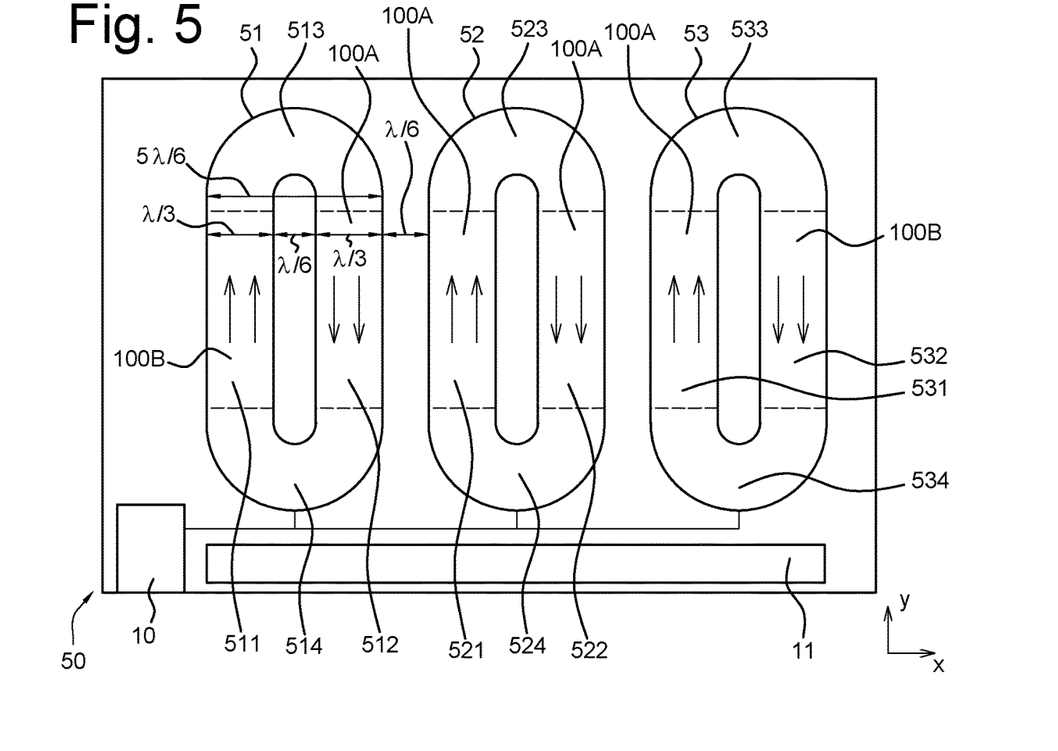
FIG. 5 shows an example of magnet apparatus according to a second embodiment of this disclosure.

FIG. 5 shows an example of magnet apparatus 50 according to a second embodiment according to this disclosure. The magnet apparatus is provided with three coils 51, 52, 53. In this example the coils 51; 52; 53 comprise two legs 511, 512; 521, 522; 531, 532 and two bent end sections 513, 514; 523, 524; 533, 534 in the x,y-plane. The coils are again assigned first legs 511, 521, 531 and second legs 512, 522, 532. The first and second legs 511, 512; 521, 522; 531, 532 of the coils are arranged parallel to each other, and the two bent sections 513, 514; 523, 524; 533, 534 are arranged opposite to each other. The first and second legs are linear segments and the bent segments can have a semi-circular shape.

Furthermore, in an embodiment the magnet apparatus may be provided with a cryostat 11 to keep the coils at a desired operating temperature.

The conductor comprises material having superconducting properties at the operating temperature like the conductors described in the examples of the first embodiment.

Furthermore, the coils 51, 52, 53 are arranged besides each other along an x-axis in x,y-plane. In this example the distance between the centers of adjacent coils 51, 52, 53 is A. Furthermore, in this example the width of the respective coils 51, 52, 53 is 5λ/6 and the width of the respective first and second legs 511, 512; 521, 522; 531, 532 is λ/3. The distance between two adjacent coils is then λ/6. The first legs and the second legs of the respective coils separately form the leg sections 100A, 100B The composition of the coils 51, 52, 53 is analog to that of the coils 21, 22, 23.

Furthermore, the magnet apparatus 4 is provided with the controller 10. The controller 10 is operationally connected to coils 51, 52, 53 and the controller 10 is further arranged such that in two adjacent coils 51, 52; 52, 53 a current direction in the first leg 512; 522 of one of the two adjacent coils 51, 52; 52, 53 is opposite to a direction of the current in the second adjacent leg 521; 531 of the other one of the two adjacent coils 51; 52; 52, 53. In FIG. 5 the current directions in the coils are represented with arrows.

This magnet apparatus also generates a magnetic field that approximate the ideal harmonic sheet current distribution as shown in FIG. 3A.

Furthermore, the coils in this embodiments in this disclosure can be provided with flared end sections.

Figure 6:
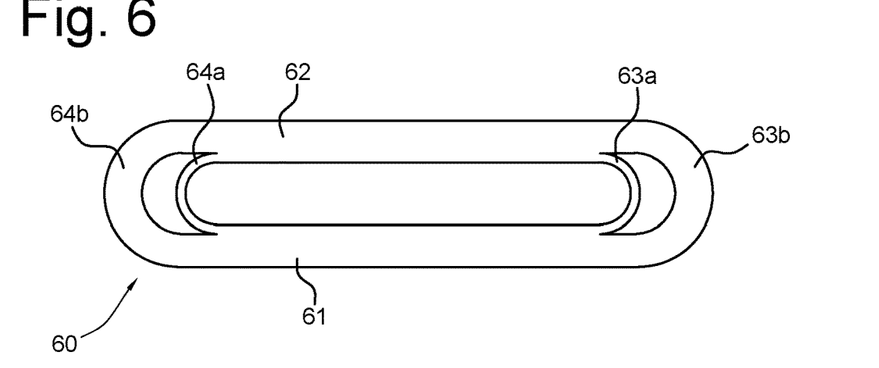
FIG. 6 show an example of a coil provided with flared end sections.

FIG. 6 show an example of a coil 60 provided with flared end section that can be used in the magnet apparatus according to the first and second embodiment. The coil 60 is provided with flared end sections 63a, 63b; 64a, 64b and linear sections 61, 62. This flared end section can be obtained by dividing the end sections in a first section 63a defined by a first radius, inner, r1 equal to the half of the distance between the linear sections and a second, outer, radius $r_2$ between r1 and the half width of the coil 60 and an a second section 63b with an inner $r_2$ and a fourth, outer, radius $r_3$ equal to the half width of the coil 60. The coil provided with the flared sections at each end provides a reduction the peak strength of the magnetic field compared to that of the linear sections. The flared end section extends the length of the coils with 2×5 cm.

Figure 7A:
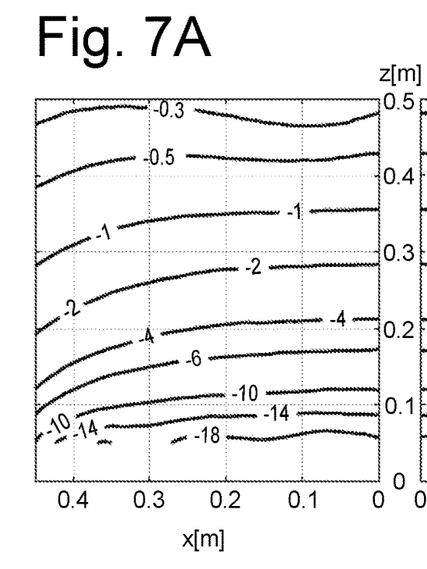
FIGS. 7A and 7B show contour lines of the vertical magnetic field gradient in two symmetry planes above the magnet as described in the first embodiment according to this disclosure.
Figure 7B:
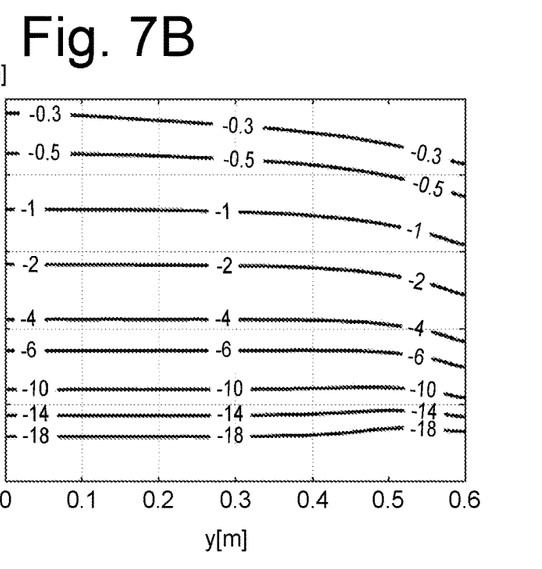
Figure 7C:
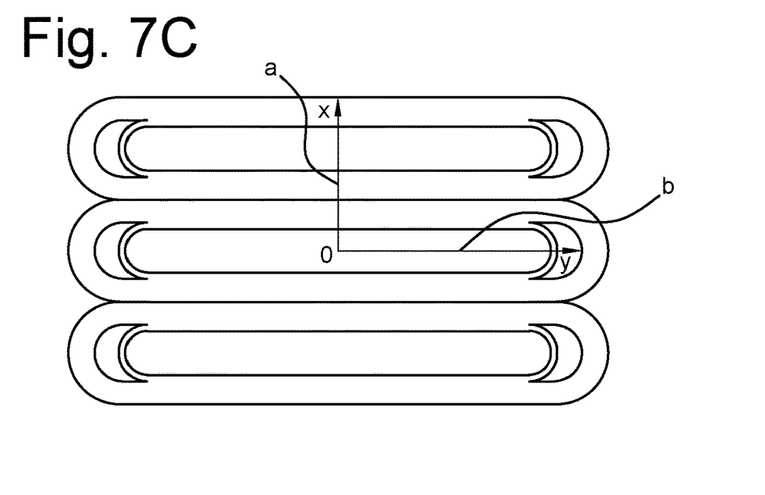
FIG. 7C shows another example of a coil provided with flared end sections and corresponding to the embodiment of FIG. 2.

FIGS. 7C, 7B shows contour lines of vertical magnetic field gradient $$\left(\frac{\mu_0 \partial |H|}{\partial z}, \text{ in } T/m\right)$$

in two symmetry planes above a magnet as described in the first embodiment according to this disclosure. FIG. 7A shows the vertical gradient in a xz-symmetry plane located at y=0. FIG. 7B shows the vertical gradient in a yz-symmetry plane located at x=0. The origin of the z-axis corresponds to the surface of the coils closest to the sketched planes. FIG. 7C shows the corresponding arrangement of the three coils according to the first embodiment.

Further embodiment of the magnet apparatus may apply different technologies, well known to the person skilled in the art, that can be based on the principles set out in the embodiments described above to have the control device driving the coils individually.

Although illustrative embodiments of the present invention have been described with reference to the accompanying drawings, it is to be understood that the invention is not limited to these embodiments. Various changes or modifications may be effected by one skilled in the art without departing from the scope of the invention as defined in the claims. Accordingly, reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that the particular features, structures, or characteristics may be combined in any suitable manner in one or more embodiments.

The invention claimed is:

1. A magnetic field gradient apparatus, especially a unidirectional magnetic field gradient apparatus, for generating a magnetic field having a magnetic field gradient in a direction perpendicular to a first plane defined by a first axis and a second axis transverse to the first axis, wherein the first axis and the second axis are in the first plane, and the magnetic field is obtained by having a current distribution of a current in the first plane with a current direction of the current distribution alternating between opposite directions parallel to the second axis with a period $\lambda$ along the first axis, and wherein the magnet apparatus comprises:

leg sections extending along the second axis and arranged besides each other along the first axis, wherein a distance (d) between adjacent leg sections is $\lambda/6$, and a width of a leg section having an adjacent leg section on either side is $\lambda/3$, as seen along the first axis, wherein the leg sections comprise a conductor for the current; and a controller configured to control current through the respective leg sections, wherein the leg sections and the controller are arranged to provide a current direction in adjacent leg sections in opposite directions to obtain the current direction of the current distribution alternating between opposite directions parallel to the second axis with the period $\lambda$ along the first axis.

2. The apparatus according to claim 1, wherein each leg section comprises a conductor comprising a material having superconducting properties at an operating temperature.

3. The apparatus according to claim 1, wherein a width of a leg section having only an adjacent leg section on one side is smaller than $\lambda/3$, as seen along the first axis, optionally the width of the leg section having only an adjacent leg section on one side is $\lambda/6$, as seen along the first axis.

4. The apparatus according to claim 1, wherein a current is equal in each leg section having an adjacent leg section on either side, as seen along the first axis.

5. The apparatus according to claim 1, wherein the apparatus comprises:

coils, optionally at least three coils, arranged besides each other, as seen along the first axis, in the first plane, wherein each coil comprises a conductor for the current, each coil further comprises a first leg, a second leg and two bent end sections in the first plane, the first and the second leg of each coil are arranged parallel to each other along the second axis in the first plane, the two bent sections are arranged opposite to each other to connect the first leg and the second leg of each coil, and wherein the first leg of a coil is adjacent the second leg of an adjacent coil and vice versa, as seen along the first axis, and the first legs and the second legs of the coils are configured and arranged to form the leg sections, wherein the controller is arranged to control current through the respective coils.

6. The apparatus according to claim 5, wherein a distance between centers of adjacent coils is $\lambda/2$, as seen along the first axis, and the controller is arranged to control a current direction in the first leg of a coil to be equal to a current direction in the second leg of an adjacent coil and vice versa.

7. The apparatus according to claim 6, wherein a width of the respective coils is $\lambda/2$, a width of the first legs is $\lambda/6$, and a width of the second legs is $\lambda/6$, as seen along the first axis.

8. The apparatus according to claim 5, wherein the first leg of a coil and the second leg of an adjacent coil, and vice versa, together form a leg section.

9. The apparatus according to claim 5, wherein the apparatus comprises three or five coils.

10. The apparatus according to claim 5, wherein a distance between centers of adjacent coils is $\lambda$, as seen along the first axis, and the controller is arranged to control a current direction in the first leg of a coil to be opposite to a current direction in the second leg of an adjacent coil and vice versa.

11. The apparatus according to claim 10, wherein a width of the respective coils is $5\lambda/6$, a width of the first legs is $\lambda/3$, and a width of the second legs is $\lambda/3$, as seen along the first axis.

12. The apparatus according to claim 10, wherein the first legs and the second legs of the respective coils separately form the leg sections.

13. The apparatus according to claim 10, wherein the apparatus comprises three coils.

14. The apparatus according to claim 5, wherein a current is equal in each respective coil.

15. The apparatus according to claim 5, wherein the respective coils are racetrack-shaped coils.

16. A magnet apparatus for generating a magnetic field, especially a unidirectional magnet field gradient apparatus for generating a magnetic field having a magnetic field gradient in a direction perpendicular to a first plane, the magnet apparatus comprising:

at least three coils arranged besides each other along a first axis in the first plane, wherein each coil comprises a conductor comprising a material having superconducting properties at an operating temperature, the coils further comprise two legs and two bent end sections in the first plane, wherein a first and a second leg are arranged parallel to each other along a second axis in the first plane transverse to the first axis, and the two bent sections are arranged opposite to each other; and a controller arranged to control currents through the respective coils to obtain a current distribution in the first plane, wherein a current direction of the current distribution is alternating between opposite directions parallel to the second axis, with a period $\lambda$ along the first axis.

17. The apparatus according to claim 16, wherein the magnet apparatus comprises three or five coils, wherein the distance between the centres of the respective coils equals $\lambda/2$, as seen along the first axis, and the controller is further arranged such that a current direction in the first leg of one of two adjacent coils is equal to a direction of the current direction in the adjacent second leg of the other one of the two adjacent coils.

18. The apparatus according to claim 17, wherein the width of the respective coils is $\lambda/2$ and the width of the first and second legs is $\lambda/6$, as seen along the first axis.

19. The apparatus according to claim 16, wherein the magnet apparatus comprises three coils, wherein the distance between the centers of adjacent coils is $\lambda$, as seen along the first axis, and the controller is further arranged such that a current direction in the first leg of one of two adjacent coils is opposite to a direction of the current direction in the second adjacent leg of the other one of the two adjacent coils.

20. The apparatus according to claim 19, wherein the width of the respective coils is $5\lambda/6$ and the width of the respective first and second legs is $\lambda/3$, as seen along the first axis.

21. The apparatus according to claim 1, wherein $\lambda$ is in the range from 30 to 150 cm.

22. The apparatus according to claim 2, wherein the material having superconducting properties comprises NbTi, $Nb_3Sn$ or $MgB_2$.

23. The apparatus according to claim 2, wherein the material having superconducting properties comprises $Bi_2Sr_2CaCu_2O_8$ or $Bi_2Sr_2Ca_2Cu_3O_{10}$, or a rare earth barium copper oxide, in particular one of the group $YBa_2Cu_3O_7$.

24. The apparatus according to claim 1, wherein the conductor comprises copper Cu or copper Cu-alloys.

25. The apparatus according to claim 5, wherein the respective coils comprise a plurality of windings of the conductor, optionally wherein the diameter of the conductor is 1.4 mm.

26. The apparatus according to claim 25, wherein a number of windings of the coils is in a range from 1000 to 3000.

27. The apparatus according to claim 5, wherein the bent end sections of the coils are flared.

28. An apparatus for separation, especially magnetic density separation, of materials, and comprising an apparatus according to claim 1.

* * * * *